United States Patent
Tanaka et al.

(10) Patent No.: US 6,780,490 B1
(45) Date of Patent: *Aug. 24, 2004

(54) TRAY FOR CONVEYING MAGNETIC HEAD FOR MAGNETIC DISK

(75) Inventors: Sigeru Tanaka, Tokyo (JP); Etuji Asano, Mie (JP); Tomohiko Tanaka, Mie (JP); Koichi Sagisaka, Mie (JP)

(73) Assignees: Yukadenshi Co., Ltd., Tokyo (JP); part interest; Alps Electric Co., Ltd., Tokyo (JP); part interest ( * ) Notice: Subject to any disclaimer, the term of this patent is extended or adjusted under 35 U.S.C. 154(b) by 179 days.

This patent is subject to a terminal disclaimer.

(21) Appl. No.: 09/806,992

(22) PCT Filed: Aug. 4, 2000

(86) PCT No.: PCT/JP00/05257

§ 371 (c)(1),
(2), (4) Date: Apr. 6, 2001

(87) PCT Pub. No.: WO01/11612

PCT Pub. Date: Feb. 15, 2001

(30) Foreign Application Priority Data

| Aug. 6, 1999 | (JP) | ............................................ 11-224191 |
| Aug. 6, 1999 | (JP) | ............................................ 11-224192 |
| Aug. 6, 1999 | (JP) | ............................................ 11-224193 |
| Mar. 10, 2000 | (JP) | ..................................... P2000-067484 |
| Mar. 10, 2000 | (JP) | ..................................... P2000-067485 |
| Mar. 10, 2000 | (JP) | ..................................... P2000-067486 |

(51) Int. Cl.$^7$ ............... H01B 1/04; B32B 5/30
(52) U.S. Cl. ............ 428/141; 428/323; 428/367; 428/412; 252/511
(58) Field of Search ................ 428/141, 323, 428/367, 412; 252/511

(56) References Cited

U.S. PATENT DOCUMENTS

| 5,643,990 A | | 7/1997 | Uehara et al. |
| 5,651,922 A | * | 7/1997 | Nahass et al. ............ 252/511 |
| 2002/0060314 A1 | * | 5/2002 | Tanaka et al. ............ 252/502 |

FOREIGN PATENT DOCUMENTS

| JP | 7-18170 | 7/1995 |
| JP | 7-277390 | 10/1995 |
| JP | 9-110080 | 4/1997 |
| JP | 11-250418 | 9/1999 |
| JP | 2000-33989 | 2/2000 |

\* cited by examiner

*Primary Examiner*—William P. Watkins, III
(74) *Attorney, Agent, or Firm*—Oblon, Spivak, McClelland, Maier & Neustadt, P.C.

(57) ABSTRACT

Trays for carrying magnetic heads for magnetic disks are provided, such as magnetic-head carrying trays which are less apt to cause electrical damage due to electrostatic discharge, an excess flow of contact current, etc. or physicochemical damage such as particle detachment, contamination with ions, etc. The trays for carrying magnetic heads for magnetic disks are trays obtained by molding a conductive thermoplastic resin composition containing a conductive loading material, e.g., a conductive filler, and have a surface resistance of from $10^3$ to $10^{12}$ Ω.

51 Claims, 3 Drawing Sheets

TRAY FOR CONVEYING MAGNETIC HEAD FOR MAGNETIC DISK

TECHNICAL FIELD

The present invention relates to trays on which magnetic heads for hard-disk drives are mounted and subjected to processing, cleaning, transfer, storage, etc. More particularly, the invention relates to trays for carrying magnetic heads for magnetic disks and are suitable for the transfer of magnetoresistive heads (MR heads).

BACKGROUND ART

Trays for magnetic heads have conventionally been produced by molding a conductive thermoplastic resin composition obtained by incorporating and dispersing a conductivity-imparting ingredient, e.g., an antistatic agent or carbon black, into an ABS resin or the like.

However, the incorporation of an antistatic agent has the following and other drawbacks: electrical conduction is influenced by the ambient humidity because the mechanism of electrical conduction is attributable to ionic conduction; the antistatic agent flows out upon cleaning and during long-term use, resulting in reduced antistatic properties; and addition of a large amount of an antistatic agent impairs heat resistance. The incorporation of carbon black has the following drawback. Although carbon black is uninfluenced by humidity, cleaning, etc., it should be added in a large amount for imparting conductivity. As a result, the surfaces of moldings have poor resistance to scratching and wearing and are hence apt to release wearing dust and carbon particles (i.e., particles).

For eliminating these problems, a material obtained by adding carbon fibers to, for example, a polycarbonate is used as trays for magnetic heads for hard disks. Compared to carbon black, carbon fibers are more effective in diminishing particle detachment.

In general, a magnetic head comprises an arm part, a head chip attached to the tip of the arm part, and a lead wire connected to the head chip. An MR head employs an MR element (magnetoresistive element) as the head chip.

MR (magnetoresistive) heads are recently coming to be mainly used in place of conventional thin-film heads in order to heighten the density of heads. In this trend, however, even a material containing carbon fibers has come not to fully satisfy a property requirement.

Namely, although trays made of a material containing carbon fibers as a conductive loading material are reduced in particle detachment as compared with trays made of a material loaded with carbon black, trays for MR heads have come to be required to attain a further diminution of particle detachment.

This is because not only MR heads themselves are sensitive to conductive particles, but also disk crushing caused by particles has come to occur frequently in practical use of MR heads due to the head/magnetic disk clearance which has become exceedingly small.

That is, particle generation from a tray for magnetic heads for hard disks occurs when fibers themselves detach from the tray surface or a resin ingredient peels off fibers, for example, in a step in which heads are cleaned with pure water with application of ultrasonic. Such particle detachment not only fouls and damages heads, but also has a fear that during use of the hard-disk drive, the particles present between the head and the hard disk serve as a foreign matter to cause head crushing.

Incidentally, the conventional thin-film head detects signals based on the current which generates when a signal magnetic field approaches the coil. In contrast, in the MR head, a slight sensing current is caused to flow through the MR element and a signal magnetic field is detected based on current resistance. Consequently, there is a high possibility in the MR head that even a slight noise current might damage the MR element. Because of this, as compared with conventional integrated magnetic heads and ICs, the MR head is far more sensitive to an electrostatic discharge attributable to a potential difference between the magnetic head and a tray and to a contact current generating upon head/tray contact.

Namely, in a process for assembling an MR head, a lead wire is connected to a head chip and an arm part is attached to a gimbal through the head chip. Although this lead wire (metal wire) is coated with a polyimide, the polyimide/metal wire contact area is always in a charge-separated, electrically unstable state due to the contact potential difference between the polyimide and the metal wire. As a result, a contact of the lead wire tip to a magnetic-head tray or the like is more apt to result in charge transfer in the contact area and this increases the possibility of damage.

Conventional trays for magnetic heads have a surface resistance of about from $10^1$ to $10^2$ $\Omega/\square$. Although such trays have no possibility of head damage caused by electrostatic discharge, they pose a serious problem that damage is caused by an excessive contact current which flows between a head and the tray or between a peripheral part and the tray due to the too low surface resistance of the tray.

In addition, a material containing carbon fibers as a conductive loading material is apt to give trays having a considerably low surface resistance. Reducing the addition amount of carbon fibers for heightening the surface resistance results in unstable contact among carbon fibers within the tray, making it impossible to obtain evenness of resistivity.

Trays made of a material containing carbon fibers further have the following problem. During cleaning with pure water, chlorine ions contained as an impurity in the carbon fibers dissolve away in the pure water. The released chlorine ions may corrode the magnetic head or serve as a foreign matter in the space between the head and a disk.

Magnetic heads are mounted on a tray so as to be in direct contact therewith, and are subjected to assembly, cleaning, transfer, and discharge. In this process, the magnetic heads are taken out of and replaced on the tray many times and, hence, friction is produced by contacts between the tray surface and the magnetic heads.

On the other hand, conventional trays for carrying magnetic heads are made of a material obtained by incorporating carbon fibers for imparting conductivity into a polycarbonate. The surfaces of magnetic-head carrying trays constituted of such a conductive polycarbonate resin composition have carbon fibers exposed thereon. Because of this and because of minute uneven surface flows during molding, these surfaces are extremely rough.

This surface roughness has aroused a problem that the polyimide coating film and the lead wire of a magnetic head suffer damage when the tray comes into contact or friction with the magnetic head.

In contrast to the conventional thin-film head in which signals are detected based on the current which generates when a signal magnetic field approaches the coil, this MR head is a device in which a slight sensing current is caused to flow through the MR element and a signal magnetic field is detected based on current resistance. Due to this mechanism, the MR head has greatly improved detection sensitivity and this enables a reduced track pitch and hence an increased capacity in media. Recently, a GMR head has come to be used which is intended to attain a further increase in capacity.

The MR head and the GMR head are extremely sensitive to contamination with, e.g., a slight amount of a corrosive gas and a slight noise current. Because of this, not only trays for carrying these heads but also various handling parts and jigs have come to be required to satisfy server performance requirements for avoiding head fouling.

The conventional trays for carrying magnetic heads include trays produced by molding a resin composition obtained by incorporating carbon fibers into a polycarbonate resin.

The polycarbonate resin used here is usually one produced by a solution method in which an alkaline aqueous solution of a dihydric phenol is reacted with phosgene in the presence of an organic solvent. By this method, a polycarbonate resin is obtained as a solution thereof in the organic solvent. As this organic solvent, chlorinated aliphatic hydrocarbons such as methylene chloride, chloroform, and carbon tetrachloride and chlorinated aromatic hydrocarbons such as chlorobenzene and chlorotoluene are used. The most generally used one is methylene chloride.

The polycarbonate resin is obtained by removing the solvent phase from the resultant polycarbonate resin solution by vaporization to conduct separation and purification. In this case, however, the organic solvent represented by methylene chloride remains in the resin although in a slight amount, because it has an excellent affinity for polycarbonates. After the resin is molded into magnetic-head carrying trays as a final product, the methylene chloride remaining in the resin generates as a volatile ingredient during the use of the trays.

The substances which have been thought to be corrosive volatile ingredients in the conventional trays for carrying magnetic heads are mostly ionic substances such as hydrochloric acid and chlorine ions. However, in trays for carrying magnetic heads having an element extremely susceptible to corrosion, such as an MR element or GMR element, even a chlorine ion precursor such as methylene chloride has come to arouse a problem.

With respect to other volatile ingredients such as alcohols and ketones also, the safety thereof for magnetic head chips has not been fully ascertained. Because of this, trays for carrying magnetic heads have come to be required to be reduced also in total outgas amount.

The invention has been achieved in view of the above-described circumstances of conventional techniques. An object of the invention is to provide a tray for carrying magnetic heads for magnetic disks which has eliminated at least one of the problems described above.

DISCLOSURE OF THE INVENTION

The tray for carrying magnetic heads for magnetic disks according to the first aspect of the invention is a tray for carrying a magnetic head for magnetic disks which comprises an arm part, a head chip attached to the tip of the arm part, and a lead wire connected to the head chip, wherein the tray is one obtained by molding a conductive thermoplastic resin composition, and when the tray is immersed in 500 ml of pure water while applying 40 kHz ultrasonic thereto for 60 seconds, the number of particles having a particle diameter of 1 μm or larger which detach from the surface of the tray is 5,000 pcs or smaller per unit surface area, cm$^2$, of the tray.

Furthermore, when this tray has a surface resistance of from $10^3$ to $10^{12}$ Ω, not only sufficient antistatic properties can be obtained but also an excessive contact current can be prevented from flowing upon contact with the tray. Consequently, magnetic heads can be prevented from suffering electrical damage.

This tray has such excellent surface evenness and stability that when the tray is immersed in 500 ml of pure water while applying 40 kHz ultrasonic thereto for 60 seconds, the number of particles having a particle diameter of 1 μm or larger which detach from the surface of the tray (hereinafter, this value is referred to as "amount of particle generation") is 5,000 pcs/cm$^2$ or smaller. Because of this, magnetic heads can be prevented from being physically or chemically fouled or damaged by the particles which have detached upon scratching, wearing, or cleaning.

The conductive thermoplastic resin composition is preferably one obtained by incorporating into a thermoplastic resin one or more conductive loading materials selected from the group consisting of polyether type polymeric antistatic agents, conductive fillers, and carbon fibrils. As the thermoplastic resin can be used one or more members selected from the group consisting of polycarbonates, poly (butylene terephthalate), poly(ethylene terephthalate), and polypropylene.

The tray for carrying magnetic heads for magnetic disks according to the second aspect of the invention is one obtained by injection-molding a conductive polycarbonate resin composition and having a surface roughness which satisfies the following (1) or (2) in a measurement employing a cutoff wavelength of 2.5 mm:

(1) the ten-point average roughness (Rz) is 5 μm or smaller;

(2) the proportion of 10%-cutting-level load length (tp) is 1% or higher and the count of peaks not smaller than ±0.1 μm based on the center line (Pc) is (0 or larger and) 100 or smaller per cm of the length of measurement.

This tray, which has a surface roughness satisfying (1) or (2) given above, can prevent magnetic heads from being damaged when the tray comes into contact or friction with the magnetic heads.

The tray for carrying magnetic heads for magnetic disks according to the third aspect of the invention is a tray for carrying a magnetic head for magnetic disks which comprises an arm part, a head chip attached to the tip of the arm part, and a lead wire connected to the head chip, wherein the tray is preferably one obtained by molding a polycarbonate resin composition containing a conductive loading material in an amount of from 0.25 to 50% by weight, and the amount of a chlorinated hydrocarbon generated from the tray having a surface area of 12.6 cm$^2$ under the conditions of a heating temperature of 85° C. and an equilibrium time of 16 hours is preferably 0.1 μg/g or a smaller when determined with a head space gas chromatogram.

In this tray, the amount of a chlorinated hydrocarbon a generated from the tray having a surface area of 12.6 cm$^2$ under the conditions of a heating temperature of 85° C. and an equilibrium time of 16 hours (hereinafter referred to simply as "amount of chlorinated-hydrocarbon generation") is 0.1 μg/g or smaller when determined with a head space gas chromatogram. Since this tray is thus reduced in the generation of volatile ingredients, the problem of magnetic-head corrosion damage can be eliminated.

The tray for carrying magnetic heads for magnetic disks according to the fourth aspect of the invention is a tray for carrying a magnetic head for magnetic disks which comprises an arm part, a head chip attached to the tip of the arm part, and a lead wire connected to the head chip, characterized in that the tray is one obtained by molding a conductive thermoplastic resin composition and having a surface resistance of from $1\times10^5$ to $1\times10^{12}$ Ω, and when the tray is immersed in 500 ml of pure water while applying 40 kHz ultrasonic thereto for 60 seconds, the number of particles having a particle diameter of 1 μm or larger which detach from the surface of the tray is 3,500 pcs/cm² or smaller. This tray can eliminate the problem of causing damage.

The tray for carrying magnetic heads for magnetic disks according to the fifth aspect of the invention is a tray for carrying a magnetic head for magnetic disks which comprises an arm part, a head chip attached to the tip of the arm part, and a lead wire connected to the head chip, characterized in that: the tray is one obtained by molding a conductive thermoplastic resin composition and having a surface resistance of from $1\times10^3$ to $1\times10_{12}$ Ω; when the tray is immersed in 500 ml of pure water while applying 40 kHz ultrasonic thereto for 60 seconds, the number of particles having a particle diameter of 1 μm or larger which detach from the surface of the tray is 5,000 pcs/cm² or smaller; the tray has such a surface roughness that the ten-point average roughness (Rz) thereof as determined through a measurement employing a cutoff wavelength of 2.5 mm is 5 μm or smaller; and the amount of a chlorinated hydrocarbon generated from the tray having a surface area of 12.6 cm² under the conditions of a heating temperature of 85° C. and an equilibrium time of 16 hours is 0.1 μg/g or smaller when determined with a head space gas chromatogram. This tray can eliminate damage occurrence.

The tray for carrying magnetic heads for magnetic disks according to the sixth aspect of the invention is a tray for carrying a magnetic head for magnetic disks which comprises an arm part, a head chip attached to the tip of the arm part, and a lead wire connected to the head chip, wherein the tray is one obtained by molding a conductive thermoplastic resin composition and having a surface resistance of from $1\times10^3$ to $1\times10^{12}$ Ω, and has such a surface roughness that in a measurement employing a cutoff wavelength of 2.5 mm, the proportion of 10%-cutting-level load length (tp) is lower than 4%. This tray can eliminate damage occurrence.

In the figures, numeral 1 denotes a tray main body, 2 a positioning rib, 3 a positioning boss, 4 a magnetic head, 11 a tray material, 12 a circuit board, 13 a rubber sheet, 14 a load, 111 an arm part, 112 a head chip, 113 a lead wire, and 114 a hole.

BEST MODE FOR CARRYING OUT THE INVENTION

Embodiments of the invention will be explained below in detail.

Figure 1:
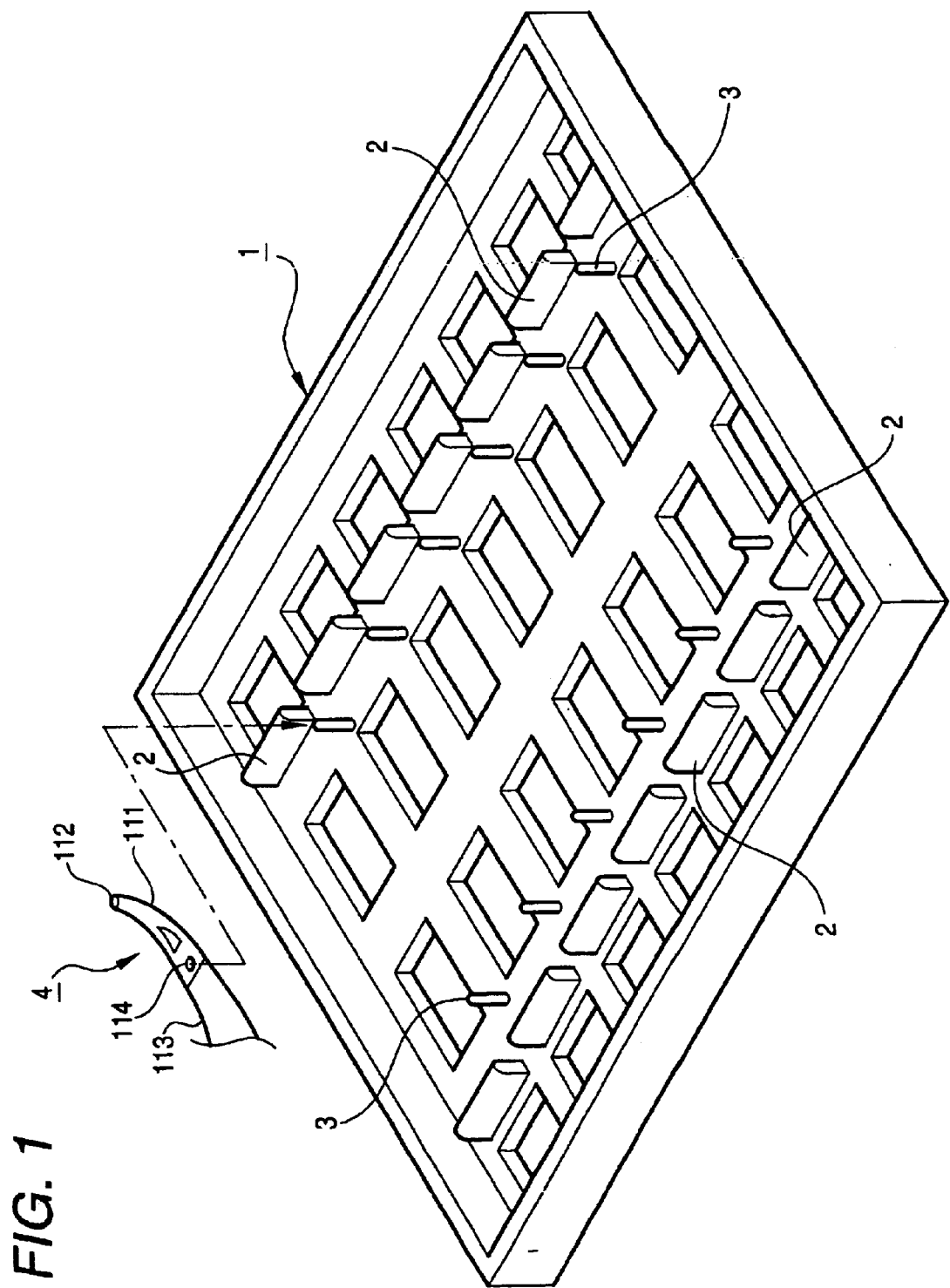
FIG. 1 is a slant view showing the magnetic-head carrying trays produced in the Examples and Comparative Examples.

As shown in FIG. 1, a first embodiment of the trays for carrying magnetic heads for magnetic disks of the invention comprises a tray main body 1, positioning ribs 2, and positioning bosses 3.

It should be noted that the trays for carrying magnetic heads for magnetic disks of the invention are not construed as being limited to the embodiment shown in FIG. 1.

A magnetic head (4 in FIG. 1) for magnetic disks which is to be mounted on the tray for carrying magnetic heads for magnetic disks of the invention and be subjected to processing, cleaning, transfer, storage, etc. with the tray comprises an arm part 111, a head chip (MR element) 112, and a lead wire 113 connected to the head chip.

The magnetic head is attached to the tray for carrying magnetic heads for magnetic disks of the invention in the following manner.

First, the magnetic head 4 is placed so that a positioning boss 3 is inserted into a hole 114 formed in the magnetic head 4. In this mounting, the direction of the arm part of the magnetic head is corrected with positioning ribs 2.

One or more magnetic heads are mounted on the tray for carrying magnetic heads for magnetic disks of the invention in this manner, and are subjected to transfer, etc.

The conductive thermoplastic resin composition for use as a molding material for the tray for magnetic heads for magnetic disks of the invention will be explained below.

The conductive thermoplastic resin composition for use in the invention comprises a thermoplastic resin and a conductive loading material.

Examples of the conductive loading material used in this conductive thermoplastic resin composition include a polymeric antistatic agent, a conductive filler, and carbon fibrils.

Usable as the polymeric antistatic agent is a polyether, a polymer containing conductive units, e.g., a quaternary ammonium salt or a sulfonic acid salt, incorporated therein block-wise or randomly, a polymeric charge-transfer type linkage compound having boron atoms in the molecule, such as that described in Unexamined Published Japanese Patent Application No. 1-259051, or the like.

Desirable of those is the polyether type polymeric antistatic agent from the standpoint of heat resistance required when the antistatic agent is melt-kneaded together with a resin to form a composite. Usable examples thereof include poly(ethylene oxide), polyetheresteramides, polyetheramideimides, ethylene oxide/epihalohydrin copolymers, and methoxypolyethylene glycol/(meth) acrylate copolymers. Preferred are polyetheresteramides and polyetheramideimides. More preferred are polyetheresteramides.

The addition amount of the polymeric antistatic agent is preferably in the range of from 1 to 100 parts by weight, especially from 5 to 60 parts by weight, most preferably from 5 to 40 parts by weight, per 100 parts by weight of the thermoplastic resin ingredient. If the addition amount thereof is smaller than that range, the resultant composition is apt to have a surface resistance higher than $10^{12}$ Ω and has poor antistatic properties. If the addition amount thereof is larger than that range, the resultant composition is poor in mechanical properties such as flexural modulus and tensile strength and in heat resistance.

Examples of the conductive filler include conductive fibers and metal oxide fillers such as titanium oxide, zinc oxide, tin oxide, and indium oxide. In the case of using a metal oxide filler which generates excess electrons due to the presence of lattice defects and thus shows conductivity, it may be one containing a dopant so as to have enhanced conductivity. For example, aluminum, antimony, and tin are used as dopants for zinc oxide, tin oxide, and indium oxide, respectively.

Especially preferred examples of the conductive filler include conductive fibers having a fiber diameter of 5 μm or smaller, desirably 2 μm or smaller, and a fiber length/diameter ratio (aspect ratio) of 5 or higher, desirably 10 or higher. Specific examples thereof include metal fibers such as stainless-steel fibers, copper fibers, and nickel fibers, conductive whiskers such as carbon whiskers, titanium oxide whiskers, and silicon carbide whiskers, and composite conductive whiskers obtained by depositing a conductive carbon coating film or conductive tin oxide coating film on the surface of insulating whiskers such as potassium titanate whiskers or aluminum borate whiskers. Especially desirable of these are aluminum borate whiskers coated with a conductive film. The fiber diameter and length of conductive fibers each herein means the average of five found values obtained through a microscopic examination.

Of the conductive loading materials described above, those having a DBP absorption of 100 cc/100 g or higher are desirable for the reasons given below. The DBP absorption thereof is preferably 250 cc/100 g or higher, more preferably 400 cc/100 g or higher.

The higher the DBP absorption, the larger the surface area of the loading material. Consequently, loading materials having higher values of DBP absorption are generally finer. On the other hand, the importation of conductivity to a resin by the incorporation of a conductive loading material is based on the formation of conduction paths resulting from continuous contacts among the particles or fibers of the conductive loading material. Furthermore, when the conductive loading material is in an imperfect contact state wherein the particles or fibers thereof are apart from one another at a distance of about from 10 to 30 Å, electrical conduction occurs among the particles or fibers of the loading material due to electron hopping, This conductivity due to hopping is low as compared with the conductivity of inner parts of the loading material. Incidentally, trays are required to have a moderate, stable surface resistance (or conductivity) as will be stated later. It is therefore desirable to obtain a resin composition stably having a moderate conductivity (e.g., $10^6$ Ω) by forming many imperfect contacts among the particles or fibers of a conductive loading material in inner parts of a resin. The higher the DBP absorption and the finer the size, the more probable that the loading material forms such imperfect contacts. Consequently, it is preferred in the invention to employ a conductive loading material having a high DBP absorption as shown above.

Incidentally, metallic fillers, carbon fibers, and the like for use as the conductive loading material are usually treated with organic surface-treating agents, e.g., a silane coupling agent, in order to compensate for affinity for polycarbonate resins. However, most of the surface-treating agents are low-molecular compounds and, hence, there are cases where such surface-treating agents contribute to an increase in outgassing from the tray obtained. In contrast, carbonaceous conductive loading materials having a DBP absorption of 100 cc/100 g or higher, e.g., carbon blacks, generally have an exceedingly active surface and show satisfactory affinity for and dispersibility in polycarbonate resins without any surface treatment. Consequently, a conductive loading material having a high DBP absorption is preferred also from the standpoint that outgassing attributable to a surface-treating agent does not occur.

The reason for the preference for reduced outgassing will be described later.

Examples of the conductive loading material which satisfies such a DBP absorption include carbonaceous conductive substances such as carbon blacks, e.g., furnace black, acetylene black, and Ketjen Black.

The addition amount of these conductive fillers is preferably from 5 to 100 parts by weight, especially from 15 to 60 parts by weight, per 100 parts by weight of the thermoplastic resin ingredient. If the addition amount thereof is smaller than that range, the resultant composition is apt to have a surface resistance higher than $10^{12}$ Ω and has poor antistatic properties. Addition amounts thereof larger than that range result in impaired moldability and an increase in the amount of particle generation.

The carbon fibrils are preferably ones having a fiber diameter of 100 nm or smaller. For example, those described in Published Japanese Translation of PCT Application No. 8-508534 can be used.

Namely, carbon fibrils each has an outer layer of graphite deposited substantially concentrically on a cylindrical core, and this fiber core has a tubular shape which is not straight but meandered. Because of this, the carbon fibrils are less apt to fall off the polycarbonate tray.

The fiber diameters of carbon fibrils depend on production processes, and have a distribution. The term fiber diameter herein means the average of five found values obtained through a microscopic examination. In case where carbon fibrils having a fiber diameter larger than 100 nm are used, the fibrils are in insufficient contact with one another in a resin and a stable resistivity is less apt to be obtained. Consequently, carbon fibrils having a fiber diameter of 100 nm or smaller are preferred.

Especially preferred are carbon fibrils having a fiber diameter of 20 nm or smaller. This is because even if such carbon fibrils fall off the tray surface and adhere to a head or the like, the possibility of causing disk crushing is low because the clearance between the head and the hard disk during operation is relatively large (about 50 μm) as compared with the fiber diameter.

On the other hand, the fiber diameter of the carbon fibrils is preferably 0.1 nm or larger, especially 0.5 nm or larger. Carbon fibrils having a fiber diameter smaller than that are exceedingly difficult to produce.

The ratio of the length to the diameter (length/diameter ratio, i.e., aspect ratio) of the carbon fibrils is preferably 5 or higher, especially 100 or higher, most preferably 1,000 or higher. However, carbon fibrils having too high an aspect ratio make the composition difficult to be molded and unsuitable for tray molding. Consequently, the length/diameter ratio is preferably 1,000,000 or lower, and preferably 100,000 or lower. This length/diameter ratio for carbon fibrils is the average of five found values obtained through an examination with a transmission electron microscope.

The carbon fibrils having a fine tubular shape has a wall thickness (thickness of the wall of the tubular body) of usually about from 3.5 to 75 nm. This thickness usually corresponds to about from 0.1 to 0.4 times the outer diameter of the carbon fibrils.

In the case where at least part of the carbon fibrils are present as aggregates, it is desirable that the resin composition for use as a feed material should contain no fibril aggregates having a diameter of about 50 μm or larger, desirably 10 μm or larger, as measured on an areal basis.

Commercial carbon fibril products can be used as such carbon fibrils. For example, "BN" manufactured by HYPERION CATALYSIS INTERNATIONAL, INC can be used.

The addition amount of the carbon fibrils is preferably from 0.25 to 9 parts by weight, especially from 0.5 to 6 parts by weight, per 100 parts by weight of the thermoplastic resin ingredient. If the addition amount thereof is smaller than that, conductivity is less apt to be imparted. On the other hand, even when the fibrils are added in an amount larger than that, not only the resultant improvement in effect is insufficient for the increase in amount, but also the results are particle generation from the tray and reduced moldability.

The various conductive loading materials described above may be used alone or in combination of two or more thereof.

Desirable among the polymeric antistatic agents, conductive fillers, and carbon fibrils described above are carbon fibrils from the standpoints of reduced particle generation and reduced ion contamination.

Examples of the thermoplastic resin include aliphatic polyolefins such as polyethylene, polypropylene, polybutene, and polymethylpentene, alicyclic polyolefins, and non-olefin resins such as polycarbonates, poly(butylene terephthalate), poly(ethylene terephthalate), poly(phenylene sulfide), various polyamides (e.g., nylon 6,66, nylon 610, and nylon MXD6), polyetherimides, polysulfones, polyethersulfones, polyetheretherketones, acrylic resins, styrene resins, modified poly(phenylene ether)s, and liquid-crystal polyesters.

Desirable among the thermoplastic resins shown above are those having a heat distortion temperature (ASTM D684, 4.6-Kg load) of 110° C. or higher from the standpoint of heat resistance during a drying step. Especially preferred from the standpoints of heat resistance and cost are polypropylene, polycarbonates, poly(ethylene terephthalate), poly(butylene terephthalate), and modified poly(phenylene ether)s. Furthermore, preferred from the standpoint of dimensional accuracy, e.g., warpage, are polycarbonates, poly(butylene terephthalate), and poly (ethylene terephthalate), in particular polycarbonates.

Commercial polycarbonate resin products can be used as such polycarbonate resins. For example, "NOVAREX" and "Iupulon" both manufactured by Mitsubishi Engineering Plastics Co., Ltd., "Toughlon" manufactured by Teijin Chemicals, "Lexan" manufactured by GE Plastic, and the like can be used. Desirable among these polycarbonate resins are those having a melt flow rate (MFR) as measured at 280° C. and 2.16 kg of 3 g/10 min or higher, especially 6 g/10 min or higher, from the standpoint of ease of controlling the surface roughness of the magnetic-head tray.

Those resins can be used alone or in combination of two or more thereof.

Various additive ingredients can be incorporated into the thermoplastic resin composition according to need as long as the incorporation thereof does not defeat the objects of the invention. Examples thereof include inorganic fibrous reinforcements such as glass fibers, silica fibers, silica-alumina fibers, potassium titanate fibers, and aluminum borate fibers, organic fibrous reinforcements such as aramid fibers, polyimide fibers, and fluororesin fibers, inorganic loading materials such as talc, calcium carbonate, mica, glass beads, glass powders, and glass balloons, and various additives such as solid lubricants, e.g., fluororesin powders and molybdenum disulfide, plasticizers, e.g., paraffin oils, antioxidants, heat stabilizers, light stabilizers, ultraviolet absorbers, neutralizing agents, lubricants, compatibilizing agents, antifogging agents, antiblocking agents, slipping agents, dispersants, colorants, antifungal agents, and fluorescent brighteners.

Processes for producing the tray of the invention are not particularly limited as long as they are suitable for the matrix resin selected, and the tray can be produced by an ordinary method for processing thermoplastic resins. For example, a thermoplastic resin composition can be produced by mixing a thermoplastic resin with a conductive loading material and then melt-kneading the mixture with a Banbury mixer, roll mill, Brabender, single-screw kneading extruder, twin-screw kneading extruder, kneader, or the like. Thereafter, this resin composition is molded into a given shape by various melt molding techniques, whereby a tray can be obtained. Examples of the molding techniques include press molding, extrusion molding, vacuum forming, blow molding, injection molding, and the like. Especially desirable among these molding techniques are injection molding and vacuum forming.

Besides the general injection molding technique, various injection molding techniques can be used, such as insert injection molding for integral molding with a metallic part or another part, two-color injection molding, core-back injection molding, sandwich injection molding, injection press molding, and the like. In injection molding, it is necessary to select appropriate conditions according to purposes because the trays obtained vary in surface resistance with resin temperature, mold temperature, and molding pressure.

When the tray of the invention is immersed in 500 ml of pure water while applying 40 kHz ultrasonic thereto for 60 seconds, the number of particles having a particle diameter of 1 $\mu$m or larger which detach from the surface of the tray is preferably 5,000 pcs/cm$^2$ or smaller. If this amount of particle generation exceeds 5,000 pcs/cm$^2$, scratching and friction occur and cleaning the tray poses a problem that particles which have fallen off cause fouling or damage. In the invention, the amount of particle generation is preferably 3,500 pcs/cm$^2$ or smaller, especially 1,000 pcs/cm$^2$ or smaller.

When the tray of the invention is immersed in 50 ml of pure water while stirring the water at 60° C. for 60 minutes, the amount of chlorine ions which dissolve away from the tray is preferably 0.01 $\mu$g or smaller per unit surface area (cm$^2$) of the tray. If this amount of chlorine ion dissolution exceeds 0.01 $\mu$/cm$^2$, there is a problem that the chlorine ions which have dissolved away upon tray cleaning cause corrosion or foreign-matter generation during use of the tray. In the invention, the amount of chlorine ion dissolution is especially preferably 0.005 $\mu$g/cm$^2$ or smaller.

In the case of a tray employing carbon fibers as a conductive loading material, there may be a problem that the organic ingredient used as a surface-treating agent for the carbon fibers adheres to a magnetic head to foul or damage the magnetic head or serve as a foreign matter in the space between the magnetic head and a disk. In the invention, from the standpoint of eliminating this problem, the amount of nonvolatile organics dissolving away from the tray, as determined by the method of determining the amount of nonvolatile-organic dissolution which will be described later, is preferably 0.5 $\mu$g or smaller per unit surface area, cm$^2$, of the tray.

The tray of the invention is preferably one made of a polycarbonate in which the amount of chlorinated-hydrocarbon generation as determined with a head space gas chromatogram by the following determination method is, for example, 0.1 $\mu$g/g or smaller.

<Method of Determining Gas Generation Amount>

Two assay samples (each having dimensions of 22 mm (length)×10 mm (width)×3 mm (thickness); total surface area, 12.6 cm$^2$) cut out of a tray are placed in a vial having a capacity of 22 mL. Thereto is added 10 $\mu$L of n-octane as an internal reference. A gas is extracted under the conditions of a heating temperature of 85° C. and an equilibrium time of 16 hours. Thereafter, analysis is made with a gas chromatogram (GC), and the amount of generation is calculated from the areal ratio between the gas and n-octane in the ion chromatogram.

However, in the case of using assay samples having a different total surface area, the found value may be converted so as to correspond to a total surface area of 12.6 cm$^2$.

As long as this amount of chlorinated-hydrocarbon generation is 0.1 $\mu$g/g or smaller, the tray produces little adverse influence on heads. The amount of chlorinated-hydrocarbon generation is desirably 0.02 $\mu$g/g or smaller.

In view of adverse influences on heads, the total outgas amount is preferably 1 $\mu$g/g or smaller, especially 0.5 $\mu$g/g or smaller, the amount of methylene chloride generation is preferably 0.1 $\mu$g/g or smaller, and the amount of hydrocarbon generation is preferably 0.5 $\mu$g/g or smaller, especially 0.2 $\mu$g/g or smaller. This hydrocarbon is n-heptane, n-hexane, cyclohexane, benzene, toluene, or the like, which is used for the polycarbonate resin production which will be described below.

Methods for obtaining a tray having such gas generation amounts by molding a polycarbonate resin composition containing a conductive loading material in the invention will be explained below.

As this polycarbonate resin can be used a general one produced by reacting a dihydric phenol compound with phosgene, for example, by interfacial polymerization or solution polymerization such as the pyridine method or chloroformate method. Examples of methods for obtaining a tray which does not contain a volatile ingredient such as the chlorinated hydrocarbon, e.g., methylene chloride, used as a polymerization solvent include the following methods (A), (C), and (D). Also effective is to use a polycarbonate resin produced by a method in which no solvent is used, as in (B) below.

(A) In purifying a polycarbonate resin obtained with a chlorinated hydrocarbon as a solvent, an aqueous suspension of the polycarbonate resin is obtained and this suspension is subjected to filtration, centrifugal separation, or the like to obtain a wet powder. For example, a poor solvent for polycarbonate resins (a solvent in which polycarbonates are insoluble or sparingly soluble), e.g., n-heptane, is added to a methylene chloride solution of a polycarbonate to such a degree as not to cause precipitation, and the resultant resin solution is dropped into warm water suitably with wet grinding to distill off the poor solvent (hereinafter, this method is referred to as "purification by dropping into warm water"). When this operation for distilling off the poor solvent is conducted with heating at 80 to 100° C., then the chlorinated hydrocarbon, e.g., methylene chloride, which is causative of a corrosive volatile gas is efficiently removed.

(B) A polycarbonate resin obtained by a polymerization method in which no polymerization solvent is used (e.g., the polycarbonate resin disclosed, e.g., in Unexamined Published Japanese Patent Application No. 4-103626) is used.

(C) Vacuum degassing is conducted in melt kneading or melt molding. For example, a polycarbonate resin obtained by an ordinary purification method or by method (A) or method (B) above is fed to a vented extruder and the solvent is removed through the vent by vacuum degassing. In this operation, addition of water to the feed powder or molten resin is preferred from the standpoint of removing the residual solvent, as described in Unexamined Published Japanese Patent Application No. 9-29738.

(D) A resin composition employing a polycarbonate resin a obtained by an ordinary purification method or by method (A) to (C) above is molded into a tray, and this tray is annealed to thereby remove a volatile ingredient. In this case, the annealing is preferably conducted at a temperature of 80° C. or higher for 30 minutes or longer. If a the temperature for this annealing exceeds 140° C., there is a possibility that the tray might suffer a dimensional change or deformation. Furthermore, even when the time for the annealing exceeds 20 hours, an improvement in volatile-removing effect cannot be expected. Consequently, the annealing is preferably conducted at from 80 to 140° C. for from 30 minutes to 20 hours.

Among the methods (A) to (D) described above, method (A) is effective in diminishing a chlorinated hydrocarbon but has a high possibility that a poor-solvent ingredient such as n-heptane might remain. Although n-heptane does not corrode heads, there is a problem that in the recent MR elements having an increased density, n-heptane may form fine deposits on the surfaces of the head elements. It is therefore desirable that the amount of generating hydrocarbons including n-heptane should also be minimized as stated hereinabove.

From the standpoint of efficiently removing not only n-heptane, which is thought to arouse such a problem, but also oligomers and other low-molecular volatile ingredients, the method (C) of solvent removal by vacuum degassing is especially desirable. This vacuum degassing with an extruder, i.e., method (C), may be conducted during melt-kneading with a conductive loading material for forming a composite, or may be conducted before or after this kneading.

The tray for carrying magnetic heads for magnetic disks of the invention preferably further has a surface roughness which satisfies the following (1) or (2) in a measurement employing a cutoff wavelength of 2.5 mm:

(1) the ten-point average roughness (Rz) is 5 $\mu$m or smaller;

(2) the proportion of 10%-cutting-level load length (tp) is 1% or higher and the count of peaks not smaller than ±0.1 $\mu$m based on the center line (Pc) is (0 or larger and) 100 or smaller per cm of the length of measurement.

The ten-point average roughness (Rz) herein is calculated from a roughness curve and is the sum of the average of the absolute values of the altitudes of the five highest peaks which are measured in the direction of longitudinal magnification from the mean line of the roughness curve and the average of the absolute values of the altitudes of the five lowest bottoms which are measured likewise. Consequently, the smaller the value of Rz, the smoother the surface.

In the case of an exceedingly smooth surface which does not have five or more peaks or bottoms within the range of measurement, it is impossible to calculate the roughness. In such a case, the sum of the value for the maximum peak and that for the maximum bottom, i.e., Rmax, can be used as a substitute in the invention.

On the other hand, the proportion of 10%-cutting-level load length (tp) is a value obtained by withdrawing a portion having a standard length from a roughness curve, calculating the ratio of the sum of the cut lengths obtained when the withdrawn curve is cut parallel to the mean line at a level lower than the highest peak by 10% (load length) to the standard length, and expressing this ratio in terms of percentage (JIS B0601).

Furthermore, the count of peaks not smaller than ±0.1 $\mu$m (Pc) is a value obtained by drawing lines which cross a roughness curve and are parallel to the mean line respectively at a height and a depth of ±0.1 μm based on the mean line, and counting the recesses and protrusions which longitudinally cross either of those lines within a standard length.

A tray having such a surface roughness that the surface smoothness thereof is high and the ten-point average roughness (Rz) is 5 μm or lower is less apt to damage magnetic heads including the polyimide coating. Incidentally, trays having an Rz of 0.1 μm or lower are difficult to produce, and the production thereof is costly. Consequently, the value of Rz is preferably in the range of from 0.1 μm to 5 μm, more preferably in the range of from 0.1 μm to 4 μm, especially preferably in the range of from 0.1 μm to 3 μm.

Furthermore, even a tray having a ten-point average roughness (Rz) exceeding 5 μm is less apt to damage magnetic heads and is satisfactory, when the proportion of 10%-cutting-level load length (tp) thereof is 1% or higher and the peak count (Pc) thereof is 100 or smaller, desirably 80 or smaller, per cm.

Conversely, a tray having a ten-point average roughness (Rz) exceeding 5 μm and a proportion of 10%-cutting-level load length (tp) lower than 1% has protrusions with a sharp tip and is more apt to damage magnetic heads. Furthermore, when a tray has such a surface roughness that the ten-point average roughness (Rz) thereof exceeds 5 μm, the proportion of 10%-cutting-level load length (tp) thereof is 1% or higher, and the peak count (Pc) thereof exceeds 100, then the tray is more apt to damage magnetic heads.

Incidentally, trays obtained as injection-molded articles from a resin composition comprising a noncrystalline polycarbonate resin having a relatively high melt viscosity and a conductive loading material incorporated therein are less apt to have a surface to which the surface state of the mold has been transferred, and have a surface roughness formed by uneven flows around the surface due to flowability, the shape of the loading material, shrinkage, molding conditions, etc. and by the exposed loading material.

In the surface in such a rough state, when the number of recesses and protrusions in terms of Pc value is not larger than that range, then the protrusions and recesses have gentle slopes and the peaks of the protrusions are not sharp. This surface state lessens the effect of "scratching" in friction with magnetic heads. Conversely, when the value of Pc exceeds 100, the protrusions each has a sharp peak to damage magnetic heads. When the peak count (Pc) is from 0 to 80, the tray is especially reduced in magnetic-head damaging.

The surface of a mold can be modified by treating the mold surface with discharge processing, etching, sandblasting, etc.

The surface roughness can be controlled by using a polycarbonate resin composition improved in mold surface transferability thereto or by modifying the mold surface.

In the case where magnetic heads are mounted on a tray and subjected, in this mounted state, to cleaning in water and a subsequent drying step, there may be a problem that when those parts of the tray surface which are in contact with the magnetic heads have a low ten-point average roughness (Rz), then the cleaning water which has penetrated between the tray and the magnetic heads cannot be removed rapidly, resulting in a reduced drying efficiency. Furthermore, in the case where a tray for magnetic heads has too high surface smoothness, the tray has an increased light reflectance, which interferes with a visual inspection of the magnetic heads.

From that standpoint, those parts of the magnetic-head tray on which magnetic heads are to be mounted preferably have such a surface roughness that the ten-point average roughness (Rz) thereof is in the range of from 5 μm to 50 μm, the proportion of 10%-cutting-level load length (tp) thereof is 1% or higher, and the peak count (Pc) thereof is (0 or larger and) 100 or smaller, preferably (0 or larger and) 80 or smaller.

EXAMPLE

The invention will be explained below in more detail by reference to Examples and Comparative Examples.

Figure 2B:
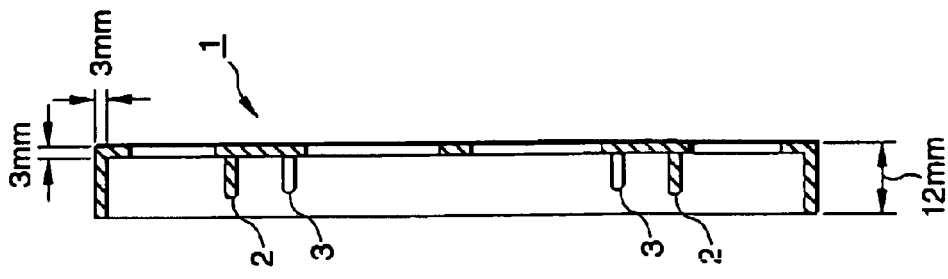
FIG. 2(b) is a sectional view taken on the line B—B of FIG. 2(a).

In the following Examples and Comparative Examples, a 75-ton injection molding machine was used to mold trays each having the shape and dimensions shown in FIG. 1 (slant view), FIG. 2(a) (plan view), and FIG. 2(b) (sectional view taken on the line B—B of FIG. 2(a)). In the figures, numeral 1 denotes a tray main body, 2 a positioning rib, 3 a positioning boss, and 4 a magnetic head.

In the Examples and Comparative Examples, various properties were evaluated by the following methods.

<Surface resistance>

Figure 2A:
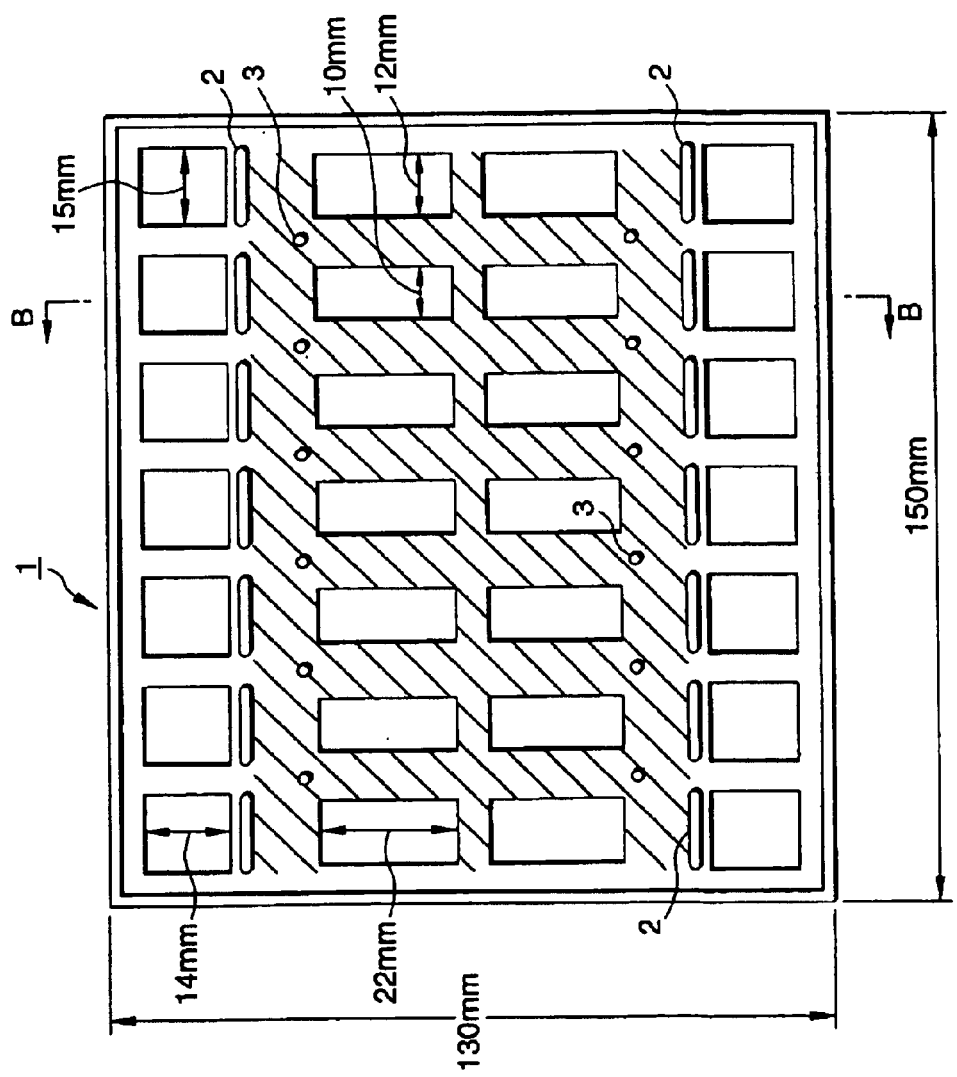
FIG. 2(a) is a plan view of the trays shown in FIG. 1.

In five arbitrary positions within the hatched area shown in FIG. 2(a), the surface resistance was measured with two probes under the conditions of a probe tip diameter of 2 mm and a probe center-to-probe center distance of 20 mm. The voltages applied to the probes were as follows. An average was calculated.

For surface resistivities of from $10^3$ Ω to lower than $10^9$ Ω: 10 V

For surface resistivities of $10^9$ Ω and higher: 100 V

However, in examining samples having a surface resistance of $10^8$ Ω or higher, probes having a tip diameter of 5 mm were used each as an assembly with a conductive silicone rubber having a thickness of 2 mm, a diameter of 5 mm, and a resistivity of 10 Ωcm or lower so as to obtain stable intimate con-tact with the sample surface.

Furthermore, the following measuring apparatus were used.

For surface resistivities of from $10^2$ Ω to lower than $10^4$ Ω: "High-Resistance Meter R8340" manufactured by Advantest Corp.

For surface resistivities of $10^4$ Ω and higher: "Hiresta AP" manufactured by Dia Instrument Co.

<Amount of Particle Generation>

One tray having a total area of from 100 to 1,000 cm$^2$ (having a total surface area of 420.8 cm$^2$ in the Examples of the invention and in the Comparative Examples) was immersed in 500 ml of pure water, and ultrasonic (4 kHz, 0.5 W/cm$^2$) was applied thereto for 60 seconds. Thereafter, the resultant pure-water extract was sucked with a particle counter for particles in liquid to determine the number of dust particles having a diameter of 1 μm or larger. Prior to this examination, the tray was subjected to a pretreatment in which the tray was cleaned with pure water for 8 minutes with application of ultrasonic and then dried in a 100° C. oven for 30 minutes. All the operations were conducted in a clean room. All the vessels used for the sample immersion were glass vessels.

<Amount of Chlorine Ion Dissolution>

Two trays having a total area of from 100 to 1,000 cm$^2$ were immersed in 480 ml of pure water in a polypropylene vessel, and this water was stirred in a 60° C. water bath for 60 minutes. Thereafter, the pure water with which ions had been extracted was analyzed by ion chromatography to determine the chlorine ions contained in the water.

<Amount of Nonvolatile-Organic Dissolution>

A tray was immersed in 500 ml of fluorocarbon detergent "Asahi Krin AK-225" manufactured by Asahi Glass Co., Ltd., and ultrasonic (40 kHz, 0.5 W/cm$^2$) was applied thereto for 60 seconds. The extract was volatilized on an aluminum pan at 100° C. and the residue was weighed.

<Magnetic-Head Corrosion Test>

Twelve MR heads were mounted on a tray and this tray was allowed to stand in a glass vessel (capacity, 201.5 mL) at 80° C. and 90% for 95 hours. Thereafter, the MR heads were taken out of the tray, and the MR element parts were examined for corrosion with a microscope at a magnification of 100 diameters. Corrosiveness was evaluated based on the following criteria.

◯ . . . corrosion was not observed on the magnetic heads (elements).

X . . . the part constituted of Permalloy had corroded in each magnetic head (element).

<Measurement of Amount of Gases Generated>

Separately, two assay samples having dimensions of 22 mm (length) by 10 mm (width) by 3 mm (thickness) (total surface area, 12.6 cm$^2$) were cut out of a tray. Gas extraction was conducted in a vial having a capacity of 22 mL and containing 10 μL of n-octane as an internal reference under the conditions of a heating temperature of 85° C. and an equilibrium time of 16 hours.

The gases generated in the vial were examined with a gas chromatogram (GC/MS). The conditions used for this examination were as follows.

Apparatus: "GC/MS QP5050" manufactured by Shimadzu Corp.

Column: CHROMPAK PORAPLOE Q
 0.32 mm×25 m

Column temperature: 35-240° C. (10° C./min)

Injection hole temperature: 320° C.

Interface temperature: 280° C.

Tray gas: helium

Injection hole pressure: 100 K Pas

Total flow rate: 60 mL/min

Injection amount: 2 mL

As a result of the qualitative analysis of the gases generated, the gases were found to comprise n-heptane, acetone, 1-propene, and 2-propanol as the main components and further contained other minor components.

The total outgas amount, the amount of methylene chloride generation, and the amount of n-heptane generation were calculated respectively using the following equations. The results obtained are shown in Table 1.

Total outgas amount($\mu g / g$) =
$$\frac{\text{(total peak area for the sample)} - \text{(total peak area for blank)}}{\text{(peak area for } n\text{-octane)} / \text{(weight of } n\text{-octane}(g))} \times \frac{1}{\text{(sample weight}(g))}$$

Amount of methylene chloride generation($\mu g / g$) =
$$\frac{\text{(peak area for methylene chloride)}}{\text{(peak area for } n\text{-octane)} / \text{(weight of } n\text{-octane}(g))} \times \frac{1}{\text{(sample weight}(g))}$$

Amount of heptane generation($\mu g / g$) =
$$\frac{\text{(peak area for heptane)}}{\text{(peak area for } n\text{-octane)} / \text{(weight of } n\text{-octane}(g))} \times \frac{1}{\text{(sample weight}(g))}$$

<Surface Roughness>

Using surface roughness meter "Surfcom" manufactured by Tokyo Seimitsu, surface roughness was measured under the conditions of a cutoff wavelength of 2.5 mm, a length of measurement of 5 mm, and a speed of measurement of 0.3 mm/S.

The measurement was made on arbitrary five parts in the hatched area shown in FIG. 2(a) which was to come into contact with magnetic heads. An average was calculated for each parameter. The value of Pc was doubled to convert it into a value corresponding to 1 cm.

<Damage Test>

Figure 3:
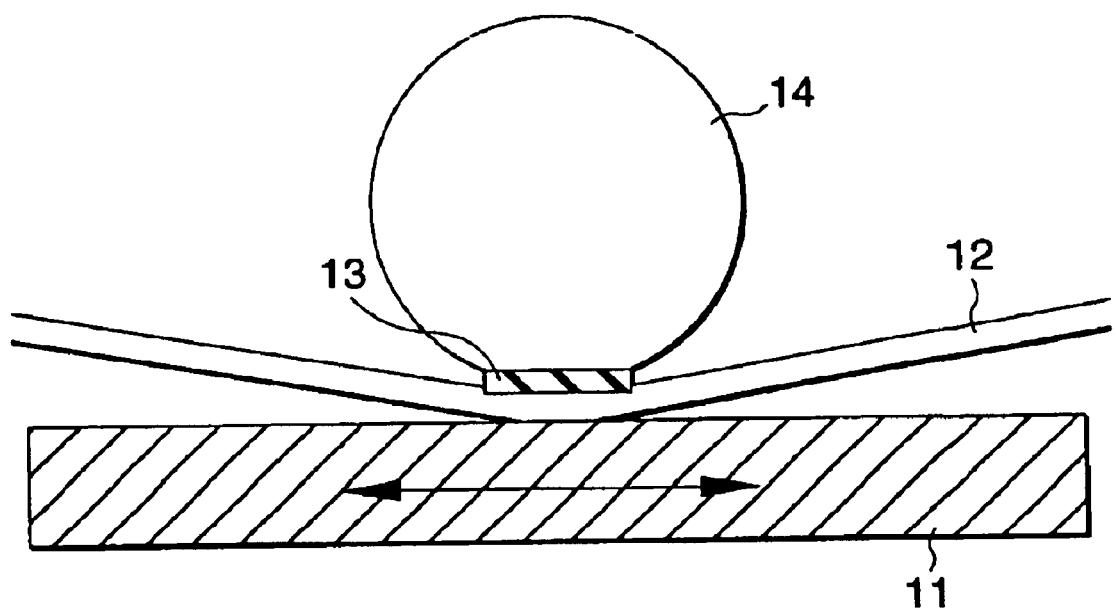
FIG. 3 is a sectional view illustrating the method of a damage test used in the Examples and Comparative Examples.

The property of damaging magnetic heads was evaluated by the method shown in FIG. 3. A tray material (sample) 11 was taken out of the hatched area shown in FIG. 2(a) which was to come into contact with magnetic heads. A flexible printed circuit board (FPC) (width, 10 mm) 12 which employed a polyamide as the base and was to be used as the lead wire of a magnetic head was pressed against the sample 11 by means of a load (100 g; diameter, 40 mm) 14 having a rubber sheet 13 attached thereto, and the sample 11 was slid forward and backward ten times over a span of 80 mm. After the test, the surface of the circuit board 12 was examined with an optical microscope at a magnification of from 50 to 100 diameters, and was judged based on the following criteria.

All the samples 11 for the damage test were subjected beforehand to pure-water cleaning to remove foreign substances adherent to the surface thereof. The preliminary cleaning and the damage test each was conducted in a clean room.

◎: no scratches were observed.

◯: having less than six scratches, which did not reach the copper wiring.

X: having six or more scratches, which reached the copper wiring.

Examples 1 to 7 and Comparative Examples 1 and 2

Using the formulations and kneading conditions shown in Table 1, melt-kneading was conducted with a twin-screw kneading extruder (PCM 45, manufactured by Ikegai Corp.; screw length L/screw diameter D=32) to obtain pellets of polycarbonate resin compositions. Details of the feed materials used are as follows. The incorporation and kneading of the carbon fibrils, among the following feed materials, were conducted in such a manner that a carbon fibril masterbatch was prepared beforehand by dispersing the carbon fibrils in an addition amount of 15% by weight and this masterbatch was added so as to result in a given content.

Polycarbonate 1: "NOVAREX7022A", Mitsubishi Engineering Plastics Co., Ltd.

Polycarbonate 2: "Iupulon S2000", Mitsubishi Engineering Plastics Co., Ltd.

Polyetheresteramide: "PAS-40T" manufactured by Toray Industries, Inc.

Conductive whiskers: tin oxide-coated aluminum borate whiskers "Pastoran 5110" manufactured by Mitsubishi Metal Corp. (fiber diameter, 0.8 μm; aspect ratio, 35)

Acetylene black: "Denka Black" manufactured by Denki Kagaku Kogyo K.K. (DBP absorption, 190 cc/g)

Carbon fibrils: "Type BN" manufactured by HYPERION CATALYSIS INTERNATIONAL, INC (fiber diameter, 10 nm; aspect ratio, 100 or higher)

Carbon fibers: PAN-derived carbon fibers "BESFIGHT C6-SRS" manufactured by Toho Rayon Co., Ltd. (fiber diameter, 7 $\mu$m; surface-treated with epoxy resin)

Using those pellets, trays having the shape and dimensions shown in FIGS. 1 and 2 were molded. The trays were evaluated for properties, and the results are shown in Table 2.

Incidentally, the cylinder temperature was 300° C. and the mold temperature was 90° C. That surface of the mold which corresponded to the hatched part shown in FIG. 2(a) had a surface roughness, Rmax, of 15 $\mu$m.

chip corrosion, and hardly cause frictional head damage. Furthermore, the trays in which the ten-point average roughness (Rz) is 5 $\mu$m or lower or in which the proportion of 10%-cutting-level load length (tp) is 1% or higher and the count of peaks not smaller than ±0.1 $\mu$m based on the center line (Pc) is 100 or smaller per cm of the length of measurement are found not to cause damage.

In Example 5, the magnetic head elements had corroded. This is attributable to the omission of degassing. If degassing was conducted, the tray of Example 5 can be a satisfactory tray which does not cause magnetic head elements to corrode (because outgassing could be inhibited).

The polycarbonate resin compositions used in Examples 8 to 17 and Comparative Examples 3 and 4 were prepared by the following method.

TABLE 1

| | | Example | | | | | | | | Comparative Example | |
|---|---|---|---|---|---|---|---|---|---|---|---|
| Example | | 1 | 2 | 3 | 4 | 5 | 6 | 7 | | 1 | 2 |
| Formulation for resin composition (pts.wt.) | Polycarbonate 1 | 100 | 100 | 100 | 100 | 100 | 100 | — | | 100 | 100 |
| | Polycarbonate 2 | — | — | — | — | — | — | 100 | | — | — |
| | Carbon fibrils | 4.5 | — | — | 3.2 | 4.5 | 4.5 | 4.5 | | — | — |
| | Polyetheresteramide | — | 25 | — | 10 | — | — | — | | — | — |
| | Conductive whiskers | — | — | 25 | — | — | — | — | | — | — |
| | Acetylene black | — | — | — | — | — | — | — | | 20 | — |
| | Carbon fibers | — | — | — | — | — | — | — | | — | 25 |
| Kneading conditions | Kneading temperature (° C.) | 300 | 260 | 320 | 260 | 300 | 320 | 320 | | 280 | 300 |
| | Screw rotational speed (RPM) | 100 | 100 | 100 | 100 | 100 | 300 | 300 | | 200 | 100 |
| | Discharge rate (kg/h) | 30 | 30 | 30 | 30 | 30 | 20 | 20 | | 30 | 40 |
| | Vent (kpa) | <10 | <10 | <10 | <10 | open | <10 | <10 | | <10 | open |

TABLE 2

| | | Example | | | | | | | Comparative Example | |
|---|---|---|---|---|---|---|---|---|---|---|
| Example | | 1 | 2 | 3 | 4 | 5 | 6 | 7 | 1 | 2 |
| Surface resistance (Ω) | | $6 \times 10^7$ | $2 \times 10^{11}$ | $7 \times 10^9$ | $7 \times 10^8$ | $6 \times 10^7$ | $8 \times 10^6$ | $7 \times 10^6$ | $9 \times 10^8$ | $1 \times 10^4$ |
| Amount of particle generation (pcs/cm$^2$) | | 340 | 190 | 4120 | 270 | 360 | 290 | 320 | 13160 | 5230 |
| Amount of chlorine ion dissolution ($\mu$g/cm$^2$) | | 0.0010 | — | — | — | — | — | — | — | 0.0171 |
| Amount of nonvolatile-organic dissolution ($\mu$g/cm$^2$) | | 0.45 | — | — | — | — | — | — | — | 0.72 |
| Surface roughness (※) | Rz ($\mu$m) | 1.12 | 0.98 | 4.21 | 1.01 | 1.20 | 0.98 | 1.02 | 3.12 | 18.6 |
| | tp10 (%) | 0.9 | — | 1.4 | — | 1.1 | 0.8 | 0.8 | 0.8 | 4 |
| | PC (/cm) | 80 | — | 312 | — | 103 | 67 | 92 | 282 | 154 |
| Damage | | ⊚ | ⊚ | ○ | ⊚ | ⊚ | ⊚ | ⊚ | ○ | x |
| Total outgas amount ($\mu$g/g) | | 0.10 | 0.36 | 0.17 | 0.30 | 1.2 | 0.20 | 0.18 | 0.28 | 0.98 |
| Amount of methylene chloride generation ($\mu$g/g) | | 0.02 | 0.03 | ND | 0.04 | 0.14 | ND | ND | 0.02 | 0.14 |
| Amount of n-heptane generation ($\mu$g/g) | | ND | ND | ND | ND | ND | ND | ND | ND | ND |
| Corrosion of magnetic head element | | ○ | ○ | ○ | ○ | x | ○ | ○ | ○ | x |

※ Rz ten-point average roughness ($\mu$m).
tp10 proportion of 10%-cutting-level load length.
Pc (/cm) count of peaks not smaller than ±0.1 $\mu$m based on center line (per cm of length of measurement)
ND not detectable.

Table 2 shows that the trays having an amount of particle generation of 5,000 pcs/cm$^2$ or smaller are less apt to cause head damage, and that the trays having an amount of particle generation of 3,500 pcs/cm$^2$ or smaller are effective in preventing the damage. It can also be seen that the trays of the invention are extremely reduced in the generation of methylene chloride and the like, are less apt to cause head <Method of Preparing Polycarbonate Resin Compositions>

A conductive loading material (compositions A to E and G to I) or an antistatic agent (composition F) was added to the following polycarbonate resin 1A, 2A, or 3A in a proportion shown in Table 3. These mixtures were melt-kneaded with twin-screw kneading extruder PCM 45 (screw length L/screw diameter D=32), manufactured by Ikegai Corp., under the conditions shown in Table 3 to obtain pellets of compositions A to I. The incorporation and kneading of the carbon fibrils were conducted in such a manner that a carbon fibril masterbatch was prepared beforehand by dispersing the carbon fibrils in an addition amount of 15% by weight and this masterbatch was added so as to result in a given content.

Details of the feed materials used are as follows.

Polycarbonate resin 1: "NOVAREX 7022" manufactured by Mitsubishi Engineering Plastics Co., Ltd. (MFR=13 g/10 min, 280° C., 2.16 kg)

Polycarbonate resin 2: "NOVAREX 7025" manufactured by Mitsubishi Engineering Plastics Co., Ltd. (MFR=8 g/10 min, 280° C., 2.16 kg)

Polycarbonate resin 3: "Iupulon S2000" manufactured by Mitsubishi Engineering Plastics Co., Ltd. (MFR=12 g/10 min, 280° C., 2.16 kg)

Carbon fibers: PAN-derived carbon fibers (fiber diameter, 7 μm; fiber length, 6 mm (epoxy sizing))

Conductive whiskers: tin oxide-coated aluminum borate whiskers "Pastoran 5110" manufactured by Mitsubishi Metal Corp. (average fiber diameter, 0.8 μm; average fiber length, 24 μm)

Carbon black: "Denka Black" manufactured by Denki Kagaku Kogyo K.K. (DBP absorption, 190 cc/100 g)

Carbon fibrils: "BN" manufactured by HYPERION CATALYSIS INTERNATIONAL, INC (DBP absorption, 700 cc/100 g; average fiber diameter, 10 nm; average fiber length, 1 μm or longer)

Polymeric antistatic agent: polyetheresteramide "PAS-40T" manufactured by Toray Industries, Inc.

Each polycarbonate resin composition was examined for flexural modulus in accordance with JIS K7203. The results are as shown in Table 3.

results are shown in Table 4. Incidentally, that surface of the mold which corresponded to the hatched part shown in FIG. 2(a) which was to come into contact with magnetic heads had a surface roughness, Rmax, of 1.5 μm.

Example 9

A tray was molded and subjected to the measurements of surface resistance and surface roughness and the damage test in the same manner as in Example 8, except that the molding temperature was changed to 310° C. The results are shown in Table 4.

Example 10

A tray was molded and subjected to the measurements of surface resistance and surface roughness and the damage test in the same manner as in Example 8, except that: the polycarbonate resin composition was replaced with polycarbonate resin composition B; that surface of the mold which corresponded to the hatched part shown in FIG. 2(a) which was to come into contact with magnetic heads was grained by etching so that the finished surface had such a surface roughness that the Rz was 18.5 μm, the 10%-cutting-level tp was 1.4%, and the count of peaks not smaller than ±0.1 μm (Pc) was 35 per cm of the length of measurement; and the injection molding was conducted at an injection molding temperature of 280° C. and a mold temperature of 90° C. The results are shown in Table 4.

Example 11

A tray was molded and subjected to the measurements of surface resistance and surface roughness and the damage test in the same manner as in Example 8, except that the polycarbonate resin composition was replaced with polycarbonate resin composition C and the injection molding was conducted at a molding temperature of 300° C. The results are shown in Table 4.

TABLE 3

| Polycarbonate resin composition No. | | A | B | C | D | E | F | G | H | I |
|---|---|---|---|---|---|---|---|---|---|---|
| Formulation (wt %) | Polycarbonate 1 | 90 | 80 | 82 | | | 80 | 95.7 | 95.7 | |
| | Polycarbonate 2 | | | | 95.7 | 80 | | | | |
| | Polycarbonate 3 | | | | | | | | | 95.7 |
| | Carbon fibers | 10 | | | | 20 | | | | |
| | Conductive whiskers | | 20 | | | | | | | |
| | Carbon black | | | 18 | | | | | | |
| | Carbon fibrils | | | | 4.3 | | | 4.3 | 4.3 | 4.3 |
| | Polymeric antistatic agent | | | | | | 20 | | | |
| Kneading conditions | Kneading temperature (° C.) | 300 | 320 | 280 | 320 | 300 | 260 | 300 | 320 | 320 |
| | Screw rotational speed (RPM) | 100 | 100 | 200 | 300 | 100 | 100 | 100 | 300 | 300 |
| | Discharge rate (kg/h) | 40 | 30 | 30 | 20 | 40 | 30 | 30 | 20 | 20 |
| | Vent (kPa) | <10 | <10 | <10 | <10 | Open | <10 | Open | <10 | <10 |
| Flexural modulus (kg/cm²) | | 65000 | 42000 | 25800 | 24900 | 120000 | 20500 | 24800 | 25200 | 25100 |

Example 8

Polycarbonate resin composition A (see Table 3) was injection-molded into a tray shown in FIGS. 1 and 2 with a 75-ton injection molding machine at a cylinder temperature of 290° C. and a mold temperature of 90° C. The tray obtained was subjected to the measurements of surface resistance and surface roughness and the damage test. The

Example 12

A tray was molded and subjected to the measurements of surface resistance and surface roughness and the damage test in the same manner as in Example 8, except that the polycarbonate resin composition was replaced with polycarbonate resin composition D and the injection molding was conducted at a molding temperature of 290° C. The results are shown in Table 4.

Example 13

A tray was molded and subjected to the measurements of surface resistance and surface roughness and the damage test in the same manner as in Example 12, except that the mold was made to have the same mold surface as in Example 10 and the injection molding was conducted at a molding temperature of 300° C. The results are shown in Table 4.

Example 14

A tray was molded and subjected to the measurements of surface resistance and surface roughness and the damage test in the same manner as in Example 10, except that the polycarbonate resin composition was replaced with polycarbonate resin composition F and the injection molding was conducted at a molding temperature of 280° C. The results are shown in Table 4.

Comparative Example 3

A tray was molded and subjected to the measurements of surface resistance and surface roughness and the damage test in the same manner as in Example 8, except that the polycarbonate resin composition was replaced with polycarbonate resin composition E. The results are shown in Table 4.

Example 16

A tray was molded and subjected to the measurements of surface resistance and surface roughness and the damage test in the same manner as in Example 8, except that the polycarbonate resin composition was replaced with polycarbonate resin composition G. The results are shown in Table 4.

Example 16

A tray was molded and subjected to the measurements of surface resistance and surface roughness and the damage test in the same manner as in Example 8, except that the polycarbonate resin composition was replaced with polycarbonate resin composition H. The results are shown in Table 4.

Example 17

A tray was molded and subjected to the measurements of surface resistance and surface roughness and the damage test in the same manner as in Example 8, except that the polycarbonate resin composition was replaced with polycarbonate resin composition I. The results are shown in table 4.

TABLE 4

| | | Surface resistivity ($\Omega$) | Surface roughness ※ | | | Damage | Total outgas amount ($\mu g/g$) | Amount of methylene chloride generation ($\mu g/g$) | Amount of n-heptane generation ($\mu g/g$) | Corrosion of magnetic head element | Amount of particle generation (PCS/cm$^2$) | Amount of chlorineion dissolution ($\mu g/cm^2$) | Amount of nonvolatile organic dissolution ($\mu g/cm^2$) |
|---|---|---|---|---|---|---|---|---|---|---|---|---|---|
| | | | Rz | tp10 | Pc (/cm) | | | | | | | | |
| Example | 8 | 1 × 10$^4$ | 14.9 | 8.3 | 76 | ○ | 0.22 | ND | ND | ○ | 2650 | 0.008 | 0.59 |
| | 9 | 2 × 10$^3$ | 9.76 | 2.3 | 48 | ○ | 0.21 | ND | ND | ○ | 2120 | 0.007 | 0.55 |
| | 10 | 7 × 10$^9$ | 11.4 | 10.1 | 26 | ○ | 0.17 | ND | ND | ○ | 4100 | <0.005 | 0.54 |
| | 11 | 4 × 10$^9$ | 3.32 | 0.7 | 242 | ○ | 0.28 | 0.02 | ND | ○ | 13160 | — | — |
| | 12 | 6 × 10$^7$ | 1.12 | 0.9 | 80 | ⊙ | 0.09 | ND | ND | ○ | 340 | 0.0010 | 0.45 |
| | 13 | 9 × 10$^7$ | 17.7 | 6.5 | 32 | ○ | 0.11 | ND | ND | ○ | 380 | <0.005 | 0.42 |
| | 14 | 5 × 10$^{11}$ | 12.1 | 9.2 | 25 | ⊙ | 0.36 | 0.03 | ND | ○ | 190 | — | — |
| | 15 | 6 × 10$^7$ | 1.20 | 1.1 | 103 | ⊙ | 1.2 | 0.14 | ND | x | 360 | <0.005 | 0.38 |
| | 16 | 8 × 10$^6$ | 0.98 | 0.8 | 67 | ⊙ | 0.20 | ND | ND | ○ | 290 | <0.005 | 0.40 |
| | 17 | 7 × 10$^6$ | 1.02 | 0.8 | 92 | ⊙ | 0.18 | ND | ND | ○ | 320 | <0.005 | 0.48 |
| Comparative Example | 3 | 1 × 10$^1$ | 18.6 | 4 | 154 | x | 0.75 | 0.12 | ND | x | 5230 | 0.0171 | 0.72 |
| | 4 | 9 × 10$^9$ | 18.1 | 0.8 | 95 | x | — | — | — | — | — | — | — |

※Rz ten-point average roughness ($\mu$m).
tp10 proportion of 10%-cutting-level load length.
Pc (/cm) count of peaks not smaller than ±0.1 $\mu$m based an center line (per cm of length of measurement)
ND not detectable.

Comparative Example 4

A tray was molded and subjected to the measurements of surface resistance and surface roughness and the damage test in the same manner as in Example 10, except that the mold surface was finished by discharge processing so as to have such a surface roughness that the Rz was 19.2 $\mu$m, the 10%-cutting-level tp was 0.5%, and the count of peaks not smaller than ±0.1 $\mu$m (Pc) was 101 per cm of the length of measurement. The results are shown in Table 4.

Example 15

A tray was molded and subjected to the measurements of surface resistance and surface roughness and the damage test Table 4 shows that the trays of the invention are almost free from the problem of frictional head damage, stably have a moderate value of surface resistance, and are less apt to cause electrical head damage. Namely, it can be seen that the trays in which the ten-point average roughness (Rz) is 5 $\mu$m or lower or in which the proportion of 10%-cutting-level load length (tp) is 1% or higher and the count of peaks not smaller than ±0.1 $\mu$m based on the center line (Pc) is 100 or smaller per cm of the length of measurement do not cause damage. It can be further seen that the trays having an amount of particle generation of 5,000 pcs/cm$^2$ or smaller are less apt to cause head damage, that the trays having an amount of particle generation of 3,500 pcs/cm$^2$ or smaller are effective in preventing the damage, and that the trays having an amount of particle generation of 1,000 pcs/cm² or smaller are especially effective in preventing the damage.

Table 4 furthermore shows that the trays of the invention are extremely reduced in the generation of methylene chloride and the like, are less apt to cause head chip corrosion, and are almost free from the problem of head fouling and damage caused thereby. In Example 15, outgassing occurred and the magnetic heads had corroded. This is attributable to the omission of degassing. It can be thought that if degassing was conducted in Example 15, outgassing could be inhibited and the magnetic heads did not corrode.

The invention will be explained below in more detail by reference to Examples 18 to 22 and Comparative Examples 5 and 6.

In the following Examples 18 to 22 and Comparative Examples 5 and 6 was used twin-screw kneading extruder "PCM 45" manufactured by Ikegai Corp., which had an L/D of 32 (L: screw length, D: screw diameter) and in which the barrel had such a shape that the part ranging from 4.4D to 5.8D from the front end had a vent.

Example 16

A methylene chloride solution of a polycarbonate resin produced from bisphenol A was purified to obtain a solution having a resin concentration of 20% by weight. To 200 L of this resin solution was added 40 L of n-heptane. After these ingredients were evenly mixed together, the mixture was dropped into warm water while grinding the dropped mixture with a wet grinder. During this purification by dropping into warm water, the temperature of the liquid within the vessel and the internal pressure of the vessel were regulated to 40° C. and 0.1 kg/cm², respectively.

After completion of the dropwise addition, the temperature inside the vessel was elevated to 100° C. and the solvents were removed by vaporization, which took about 15 minutes. The resultant aqueous polycarbonate resin slurry was taken out, filtered and dehydrated, and then dried at 140° C. to obtain a polycarbonate resin powder.

PAN-derived carbon fibers which had been surface-treated with an epoxy and had an average fiber diameter of 7 μm and an average fiber diameter of 6 mm were added to the polycarbonate resin obtained, in an amount of 10% by weight based on the composition. The resultant mixture was kneaded with a twin-screw kneading extruder at a temperature of 300° C. under the conditions of a screw rotational speed of 100 RPM and a discharge rate of 30 kg/h while keeping the vent open. Thus, resin composition pellets were obtained.

The pellets obtained were molded with an injection molding machine at a molding temperature of 300° C. to obtain a magnetic-head carrying tray shown in Figures (total surface area, 420.8 cm²) (mold temperature, 90° C.).

The surface resistance of the tray obtained was determined by the method given below, and the results are shown in Table 5. Incidentally, surface resistance was measured in five arbitrary positions within the hatched area shown in FIG. 2(a), and an average was calculated.

Example 19

A polycarbonate resin powder was prepared in the same manner as in Example 18. This resin was kneaded with a twin-screw kneading extruder at a temperature of 300° C. under the conditions of a screw rotational speed of 200 RPM and a discharge rate of 20 kg/h while evacuating the vent at 20 Torr to obtain pellets. These pellets were kneaded together with 18% by weight acetylene black ("Denka Black" manufactured by Denki Kagaku Kogyo K.K.; DBP absorption, 300 cc/100 g) by means of a twin-screw kneading extruder at a temperature of 280° C. under the conditions of a screw rotational speed of 200 RPM and a discharge rate of 30 kg/h while keeping the vent open. Thus, pellets of a polycarbonate resin composition were obtained.

These pellets were molded into a tray and the tray was evaluated, in the same manner as in Example 18. The value of surface resistance and the results of the corrosion test and analysis of gases generated are shown in Table 5.

Example 20

One part by weight of pure water was added to 100 parts by weight of a polycarbonate resin powder prepared in the same manner as in Example 18. This mixture was kneaded with a twin-screw kneading extruder at a temperature of 300° C. under the conditions of a screw rotational speed of 200 RPM and a discharge rate of 20 kg/h while evacuating the vent at 20 Torr to obtain pellets. To these pellets were added carbon fibrils ("Type BN" manufactured by HYPERION CATALYSIS INTERNATIONAL, INC; DBP absorption, 700 cc/100 g) in an amount of 4.3% by weight. This mixture was kneaded with a twin-screw kneading extruder at a temperature of 280° C. under the conditions of a screw rotational speed of 200 RPM and a discharge rate of 20 kg/h while evacuating the vent at 20 Torr. Thus, pellets of a polycarbonate resin composition were obtained. The incorporation and kneading of the carbon fibrils were conducted in such a manner that a carbon fibril masterbatch was prepared beforehand by dispersing the carbon fibrils in an addition amount of 15% by weight and this masterbatch was added so as to result in a given content.

These pellets were molded into a tray and the tray was evaluated, in the same manner as in Example 18. The value of surface resistance and the results of the corrosion test and analysis of gases generated are shown in Table 5.

Example 21

Pellets of a polycarbonate resin composition were produced in the same manner as in Example 3, except that the polycarbonate resin pellets used in Example 20 were replaced with "MHL-1110-111", manufactured by GE Plastic, as a polycarbonate produced by a process using no polymerization solvent. A tray was molded and evaluated in the same manner. The value of surface resistance and the results of the corrosion test and analysis of gases generated are shown in Table 5.

Example 22

A methylene chloride solution of a polycarbonate resin produced from bisphenol A was purified to obtain a solution having a resin concentration of 20% by weight. This resin solution was sprayed into 100° C. water vapor to remove the solvent and thereby directly obtain a wet powder of the polycarbonate. This powder was dried at 140° C. to obtain a polycarbonate resin powder.

The same carbon fibrils as those used in Example 20 were added in an amount of 4.3% by weight to the polycarbonate powder obtained. This mixture was kneaded with a twin-screw kneading extruder at a temperature of 280° C. under the conditions of a screw rotational speed of 200 RPM and a discharge rate of 20 kg/h while evacuating the vent at 20 Torr. Thus, pellets of a polycarbonate resin composition were obtained.

The pellets obtained were molded into a tray with an injection molding machine at a molding temperature of 300° C. Thereafter, the tray was annealed in an oven at 130° C. for 10 hours.

The tray obtained was evaluated in the same manner as in Example 18. The value of surface resistance and the results of the corrosion test and analysis of gases generated are shown in Table 5.

Comparative Example 5

The carbon fibers used in Example 18 were added to the polycarbonate resin powder obtained in Example 22, in an amount of 20% by weight based on the composition. This mixture was kneaded at a temperature of 300° C. under the conditions of a screw rotational speed of 100 RPM and a discharge rate of 30 kg/h while keeping the vent open. Thus, pellets of a polycarbonate resin composition were obtained.

These pellets were molded into a tray and the tray was evaluated, in the same manner as in Example 18. The value of surface resistance and the results of the corrosion test and analysis of gases generated are shown in Table 5.

Comparative Example 6

Pellet production, tray molding, and evaluation were conducted in the same manner as in Comparative Example 5, except that the same carbon fibrils as those used in Example 3 were added in place of the carbon fibers in an amount of 4.3% by weight. The value of surface resistance and the results of the corrosion test and analysis of gases generated are shown in Table 5.

having an amount of particle generation of 1,000 pcs/cm$^2$ or smaller are especially effective in preventing the damage.

Furthermore, the trays in which the ten-point average roughness (Rz) is 5 μm or lower or in which the proportion of 10%-cutting-level load length (tp) is 1% or higher and the count of peaks not smaller than ±0.1 μm based on the center line (Pc) is 100 or smaller per cm of the length of measurement are found not to cause damage.

Table 5 furthermore shows that the trays of the invention are almost free from the problem of head fouling and damage caused thereby, and are almost free from the problem of frictional head damage. In Example 19, many particles generated. This is partly attributable to the use of a carbon black as a conductive loading material. In Example 19, outgassing was slight and the magnetic heads suffered no corrosion and slight damage.

Industrial Applicability

As described above in detail, according to the invention, a tray for carrying magnetic heads for magnetic disks, e.g., for MR heads for magnetic disk drives, is provided which is free from problems such as electrical damage due to electrostatic discharge, an excess flow of contact current, etc. and physicochemical fouling or damage due to particle detachment or ion contamination.

What is claimed is:

1. A tray for carrying a magnetic head for magnetic disks, wherein the tray is prepared by molding a conductive thermoplastic resin composition, when the tray is immersed in 500 ml of pure water while applying 40 kHz ultrasonic thereto for 60 seconds, the number of particles having a particle diameter of 1 μm or larger which detach from the surface of the tray is 5,000 pcs/cm$^2$ or smaller, when the tray is immersed in 50 ml of pure water while stirring the water at 60° C. for 60 minutes, the amount of chlorine ions which dissolve away from the tray is 0.01 μg or smaller per unit surface area (cm$^2$) of the tray, and

TABLE 5

| | | Example | | | | | Comparative Example | |
|---|---|---|---|---|---|---|---|---|
| Example | | 18 | 19 | 20 | 21 | 22 | 5 | 6 |
| Surface resistance (Ω) | | $1 \times 10^4$ | $4 \times 10^8$ | $7 \times 10^7$ | $8 \times 10^7$ | $3 \times 10^7$ | $1 \times 10^1$ | $4 \times 10^7$ |
| Amount of methylene chloride generation (μg/g) | | ND (<0.01) | ND (<0.01) | ND (<0.01) | ND (<0.01) | 0.06 | 0.6 | 0.7 |
| Total outgas amount (μg/g) | | 1.5 | 0.8 | 0.3 | 0.6 | 0.3 | 1.2 | 1.1 |
| Amount of n-heptane generation (μg/g) | | 0.9 | 0.6 | ND (<0.01) | ND (<0.01) | ND (<0.01) | ND (<0.01) | ND (<0.01) |
| Corrosion of magnetic head (element) | | ○ | ○ | ○ | ○ | ○ | x | x |
| Surface roughness※ | Rz (μm) | 12.8 | 4.53 | 1.08 | 1.21 | 1.15 | 15.5 | 1.25 |
| | tp10 | 7.8 | 0.8 | 1.4 | 1.2 | 1.2 | 4.2 | 2.1 |
| | Pc (/cm) | 54 | 321 | 67 | 54 | 48 | 188 | 79 |
| Damage | | ○ | ○ | ⊙ | ⊙ | ⊙ | x | ⊙ |
| Amount of particle generation (PCS/cm$^2$) | | 3840 | 12380 | 280 | 190 | 370 | 5230 | 260 |
| Amount of chlorine ion dissolution (μg/cm$^2$) | | 0.007 | — | ≦0.005 | ≦0.005 | ≦0.005 | 0.0171 | ≦0.005 |
| Amount of nonvolatile rganic dissolution (μg/cm$^2$) | | 0.62 | — | 0.48 | 0.51 | 0.41 | 0.72 | 0.45 |

※Rz ten-point average roughness (μm).
tp10 proportion of 10%-cutting-level load length.
Pc (c/cm) count of peaks not smaller than ±0.1 μm based on center line (per cm of length of measurement).
ND not detectable.

Table 5 shows that the trays of the invention are extremely reduced in the generation of methylene chloride and the like, are less apt to cause head chip corrosion, stably have a moderate surface resistance, and are less apt to cause electrical head chip damage. It can also be seen that the trays having an amount of particle generation of 5,000 pcs/cm$^2$ or smaller are less apt to cause head damage, and that the trays the tray has a surface resistance of from $10^3$ to $10^{12}$ Ω.

2. The tray for carrying a magnetic head for magnetic disks of claim 1, wherein
the conductive thermoplastic resin composition comprises a thermoplastic resin and a conductive loading material, and
the conductive loading material comprises one or more members selected from the group consisting of a polyether type polymeric antistatic agent, a conductive filler, and carbon fibrils.

3. The tray for carrying a magnetic head for magnetic disks of claim 2, wherein
the thermoplastic resin comprises one or more members selected from the group consisting of polycarbonates, poly(butylene terephthalate), poly(ethylene terephthalate), and polypropylene.

4. The tray for carrying a magnetic head for magnetic disks of claim 2, wherein
the conductive loading material is carbon fibrils having a diameter of 100 nm or smaller and a length/diameter ratio of 5 or higher.

5. A tray for carrying a magnetic head for magnetic disks,
wherein the tray is prepared by injection-molding a conductive polycarbonate resin composition,
the tray has a surface roughness such that the ten-point average roughness (Rz) thereof as determined through a measurement employing a cutoff wavelength of 2.5 mm is 5 μm or smaller,
when the tray is immersed in 50 ml of pure water while stirring the water at 60° C. for 60 minutes, the amount of chlorine ions which dissolve away from the tray is 0.01 μg or smaller per unit surface area (cm$^2$) of the tray, and
the tray has a surface resistance of from $10^3$ to $10^{12}$ Ω.

6. A tray for carrying a magnetic head for magnetic disks,
wherein the tray is prepared by injection-molding a conductive polycarbonate resin composition,
the tray has a surface resistance of from $1 \times 10^3$ to $1 \times 10^{12}$ Ω,
the tray has a surface roughness such that in a measurement employing a cutoff wavelength of 2.5 mm, the proportion of 10%-cutting-level load length (tp) is 1% or higher and the count of peaks not smaller than ±0.1 μm based on the center line (Pc) is 100 or smaller per cm of the length of measurement, and
when the tray is immersed in 50 ml of pure water while stirring the water at 60° C. for 60 minutes, the amount of chlorine ions which dissolve away from the tray is 0.01 μg or smaller per unit surface area (cm$^2$) of the tray.

7. The tray for carrying a magnetic head for magnetic disks of claim 6, wherein
in the measurement employing a cutoff wavelength of 2.5 mm, the ten-point average roughness (Rz) of the tray is from 5 to 50 μm.

8. The tray for carrying a magnetic head for magnetic disks of claim 5, wherein the conductive polycarbonate resin composition contains conductive fibers having a fiber diameter of 5 μm or smaller and/or a carbonaceous conductive loading material having a DBP absorption 100 cc/100 g or higher.

9. The tray for carrying a magnetic head for magnetic disks of claim 5, wherein the conductive polycarbonate resin composition contains carbon fibrils having a fiber diameter of 100 nm or smaller and a length/diameter ratio of 5 or higher.

10. A tray for carrying a magnetic head for magnetic disks,
wherein the tray is prepared by molding a polycarbonate resin composition containing a conductive loading material in an amount of from 0.25 to 50% by weight,
the amount of a chlorinated hydrocarbon generated from the tray having a surface area of 12.6 cm$^2$ under the conditions of a heating temperature of 85° C. and an equilibrium time of 16 hours is 0.1 μg/g or smaller when determined by head space gas chromatography,
when the tray is immersed in 50 ml of pure water while stirring the water at 60° C. for 60 minutes, the amount of chlorine ions which dissolve away from the tray is 0.01 μg or smaller per unit surface area (cm$^2$) of the tray, and
the tray has a surface resistance of from $10^3$ to $10^{12}$ Ω.

11. The tray for carrying a magnetic head for magnetic disks of claim 10, wherein
the total amount of all gases generated from the tray having a surface area of 12.6 cm$^2$, the amount of methylene chloride generated therefrom, and the amount of a hydrocarbon generated therefrom in a measurement conducted under the conditions of a heating temperature of 85° C. and an equilibrium time of 16 hours are 1 μg/g or smaller, 0.1 μg/g or smaller, and 0.5 μg/g or smaller, respectively, when determined with a head space gas chromatogram.

12. The tray for carrying a magnetic head for magnetic disks of claim 10, wherein the conductive loading material is a carbonaceous conductive substance having a DBP absorption of 100 cc/100 g or higher.

13. The tray for carrying a magnetic head for magnetic disks of claim 10, wherein the conductive loading material is carbon fibrils having a diameter of 100 nm or smaller and a length/diameter ratio of 5 or higher.

14. The tray for carrying a magnetic head for magnetic disks of claim 10, wherein the polycarbonate resin is a polycarbonate resin which has been purified by dropping into warm water.

15. The tray for carrying a magnetic head for magnetic disks of claim 10, wherein the polycarbonate resin is a polycarbonate resin obtained by a solvent-free polymerization method.

16. The tray for carrying a magnetic head for magnetic disks of claim 10, which has undergone vacuum degassing during the melt kneading or melt molding of the polycarbonate resin composition.

17. The tray for carrying a magnetic head for magnetic disks of claim 10, which has been annealed at a temperature of from 80 to 140° C. for from 30 minutes to 20 hours after molding.

18. A tray for carrying a magnetic head for magnetic disks, said tray satisfying at least one of the following (1) to (5):

(1) the tray is prepared by molding a conductive thermoplastic resin composition and has a surface resistance of from $1 \times 10^3$ to $1 \times 10^{12}$ Ω,
when the tray is immersed in 500 ml of pure water while applying 40 kHz ultrasonic thereto for 60 seconds, the number of particles having a particle diameter of 1 μm or larger which detach from the surface of the tray is 5,000 pcs/cm$^2$ or smaller;

(2) the tray has a surface roughness such that in a measurement employing a cutoff wavelength of 2.5 mm, the proportion of 10%-cutting-level load length (tp) is 1% or higher and the count of peaks not smaller than ±0.1 µm based on the center line (Pc) is 100 or smaller per cm of the length of measurement;

(3) the amount of a chlorinated hydrocarbon generated from the tray having a surface area of 12.6 cm² under the conditions of a heating temperature of 85° C. and an equilibrium time of 16 hours is 0.1 µg/g or smaller when determined by head space gas chromatography, (4) when the tray is immersed in 50 ml of pure water while stirring the water at 60° C. for 60 minutes, the amount of chlorine ions which dissolve away from the tray is 0.01 µg or smaller per unit surface area (cm²) of the tray; and (5) the total amount of all gases generated from the tray having a surface area of 12.6 cm², the amount of methylene chloride generated therefrom, and the amount of a hydrocarbon generated therefrom in a measurement conducted under the conditions of a heating temperature of 85° C. and an equilibrium time of 16 hours are 1 µg/g or smaller, 0.1 µg/g or smaller, and 0.5 µg/g or smaller, respectively, when determined by head space gas chromatography.

19. A tray for carrying a magnetic head for magnetic disks, wherein the tray is prepared by molding a conductive thermoplastic resin composition, and when the tray is immersed in 50 ml of pure water while stirring the water at 60° C. for 60 minutes, the amount of chlorine ions which dissolve away from the tray is 0.01 µg or smaller per unit surface area (cm²) of the tray, and the tray has a surface resistance of from $1 \times 10^3$ to $1 \times 10^{12}$ Ω, and that when the tray is immersed in 500 ml of pure water while applying 40 kHz ultrasonic thereto for 60 seconds, the number of particles having a particle diameter of 1 µm or larger which detach from the surface of the tray is 5,000 pcs/cm² or smaller, or the tray has a surface roughness such that the ten-point average roughness (Rz) thereof as determined through a measurement employing a cutoff wavelength of 2.5 mm is 5 µm or smaller, or the amount of a chlorinated hydrocarbon generated from the tray having a surface area of 12.6 cm² under the conditions of a heating temperature of 85° C. and an equilibrium time of 16 hours is 0.1 µg/g or smaller when determined by head space gas chromatography.

20. A tray for carrying a magnetic head for magnetic disks, wherein the tray is prepared by molding a conductive thermoplastic resin composition and has a surface resistance of from $1 \times 10^3$ to $1 \times 10^{12}$ Ω, when the tray is immersed in 500 ml of pure water while applying 40 kHz ultrasonic thereto for 60 seconds, the number of particles having a particle diameter of 1 µm or larger which detach from the surface of the tray is 3,500 pcs/cm² or smaller, wherein when the tray is immersed in 50 ml of pure water while stirring the water at 60° C. for 60 minutes, the amount of chlorine ions which dissolve away from the tray is 0.01 µg or smaller per unit surface area (cm²) of the tray, and the amount of a chlorinated hydrocarbon generated from the tray having a surface area of 12.6 cm² under the conditions of a heating temperature of 85° C. and an equilibrium time of 16 hours is 0.1 µg/g or smaller when determined by head space gas chromatography.

21. A tray for carrying a magnetic head for magnetic disks, wherein the tray is prepared by molding a conductive thermoplastic resin composition and has a surface resistance of from $1 \times 10^3$ to $1 \times 10^{12}$ Ω, when the tray is immersed in 500 ml of pure water while applying 40 kHz ultrasonic thereto for 60 seconds, the number of particles having a particle diameter of 1 µm or larger which detach from the surface of the tray is 5,000 pcs/cm² or smaller, the tray has a surface roughness such that the ten-point average roughness (Rz) thereof as determined through a measurement employing a cutoff wavelength of 2.5 mm is 5 µm or smaller, the amount of a chlorinated hydrocarbon generated from the tray having a surface area of 12.6 cm² under the conditions of a heating temperature of 85° C. and an equilibrium time of 16 hours is 0.1 µg/g or smaller when determined with a head space gas chromatogram, and when the tray is immersed in 50 ml of pure water while stirring the water at 60° C. for 60 minutes, the amount of chlorine ions which dissolve away from the tray is 0.01 µg or smaller per unit surface area (cm²) of the tray.

22. A tray for carrying a magnetic head for magnetic disks, wherein the tray is prepared by molding a conductive thermoplastic resin composition and has a surface resistance of from $1 \times 10^3$ to $1 \times 10^{12}$ Ω, wherein the tray has a surface roughness such that in a measurement employing a cutoff wavelength of 2.5 mm, the proportion of 10%-cutting-level load length (tp) is lower than 4%, when the tray is immersed in 50 ml of pure water while stirring the water at 60° C. for 60 minutes, the amount of chlorine ions which dissolve away from the tray is 0.01 µg or smaller per unit surface area (cm²) of the tray, and the amount of a chlorinated hydrocarbon generated from the tray having a surface area of 12.6 cm² under the conditions of a heating temperature of 85° C. and an equilibrium time of 16 hours is 0.1 µg/g or smaller when determined with a head space gas chromatogram.

23. The tray for carrying a magnetic head for magnetic disks of claim 6, wherein the conductive polycarbonate resin composition contains conductive fibers having a fiber diameter of 5 µm or smaller and/or a carbonaceous conductive loading material having a DBP absorption of 100 cc/100 g or higher.

24. The tray for carrying a magnetic head for magnetic disks according to claim 4, wherein the amount of carbon fibrils is from 0.25 to 9 parts by weight per 100 parts by weight of the resin.

25. The tray for carrying a magnetic head for magnetic disks according to claim 9, wherein the amount of carbon fibrils is from 0.25 to 9 parts by weight per 100 parts by weight of the resin.

26. The tray for carrying a magnetic head for magnetic disks according to claim 13, wherein the amount of carbon fibrils is from 0.25 to 9 parts by weight per 100 parts by weight of the resin.

27. A tray carrying a magnetic head for magnetic disks, wherein the tray is prepared by molding a conductive thermoplastic resin composition according to claim 1.

28. A tray carrying a magnetic head for magnetic disks, wherein the tray is prepared by injection-molding a conductive polycarbonate resin composition according to claim 2.

29. A tray carrying a magnetic head for magnetic disks, wherein the tray is prepared by injection-molding a conductive polycarbonate resin composition according to claim 3.

30. A tray carrying a magnetic head for magnetic disks, wherein the tray is prepared by molding a polycarbonate resin composition according to claim 4.

31. A tray carrying a magnetic head for magnetic disks, wherein the tray is prepared by molding a conductive thermoplastic resin composition according to claim 5.

32. A tray carrying a magnetic head for magnetic disks, wherein the tray is prepared by molding a conductive thermoplastic resin composition according to claim 6.

33. A tray carrying a magnetic head for magnetic disks, wherein the tray is prepared by molding a conductive thermoplastic resin composition according to claim 7.

34. A tray carrying a magnetic head for magnetic disks, wherein the tray is prepared by molding a conductive thermoplastic resin composition according to claim 8.

35. A tray carrying a magnetic head for magnetic disks, wherein the tray is prepared by molding a conductive thermoplastic resin composition according to claim 9.

36. A tray carrying a magnetic head for magnetic disks, wherein the tray is prepared by molding a conductive thermoplastic resin composition according to claim 10.

37. A tray carrying a magnetic head for magnetic disks, wherein the tray is prepared by molding a conductive thermoplastic resin composition according to claim 12.

38. A tray carrying a magnetic head for magnetic disks, wherein the tray is prepared by molding a conductive thermoplastic resin composition according to claim 13.

39. A tray carrying a magnetic head for magnetic disks, wherein the tray is prepared by molding a conductive thermoplastic resin composition according to claim 14.

40. A tray carrying a magnetic head for magnetic disks, wherein the tray is prepared by molding a conductive thermoplastic resin composition according to claim 15.

41. A tray carrying a magnetic head for magnetic disks, wherein the tray is prepared by molding a conductive thermoplastic resin composition according to claim 16.

42. A tray carrying a magnetic head for magnetic disks, wherein the tray is prepared by molding a conductive thermoplastic resin composition according to claim 17.

43. A tray carrying a magnetic head for magnetic disks, wherein the tray is prepared by molding a conductive thermoplastic resin composition according to claim 18.

44. A tray carrying a magnetic head for magnetic disks, wherein the tray is prepared by molding a conductive thermoplastic resin composition according to claim 19.

45. A tray carrying a magnetic head for magnetic disks, wherein the tray is prepared by molding a conductive thermoplastic resin composition according to claim 20.

46. A tray carrying a magnetic head for magnetic disks, wherein the tray is prepared by molding a conductive thermoplastic resin composition according to claim 21.

47. A tray carrying a magnetic head for magnetic disks, wherein the tray is prepared by molding a conductive thermoplastic resin composition according to claim 22.

48. A tray carrying a magnetic head for magnetic disks, wherein the tray is prepared by molding a conductive thermoplastic resin composition according to claim 23.

49. A tray carrying a magnetic head for magnetic disks, wherein the tray is prepared by molding a conductive thermoplastic resin composition according to claim 24.

50. A tray carrying a magnetic head for magnetic disks, wherein the tray is prepared by molding a conductive thermoplastic resin composition according to claim 25.

51. A tray carrying a magnetic head for magnetic disks, wherein the tray is prepared by molding a conductive thermoplastic resin composition according to claim 26.

* * * * *